United States Patent
Cho et al.

(10) Patent No.: US 11,203,703 B2
(45) Date of Patent: Dec. 21, 2021

(54) POLISHING SLURRY AND METHOD OF POLISHING SUBSTRATE BY USING THE POLISHING SLURRY

(71) Applicants: SAMSUNG DISPLAY CO., LTD., Yongin-si (KR); UBmaterials Inc., Yongin-si (KR)

(72) Inventors: Hyunjin Cho, Yongin-si (KR); Joonhwa Bae, Yongin-si (KR); Byoungkwon Choo, Yongin-si (KR); Woojin Cho, Yongin-si (KR); Jinhyung Park, Yongin-si (KR)

(73) Assignees: SAMSUNG DISPLAY CO., LTD., Yongin-si (KR); UB MATERIALS INC., Yongin-si (KR)

( * ) Notice: Subject to any disclaimer, the term of this patent is extended or adjusted under 35 U.S.C. 154(b) by 0 days.

(21) Appl. No.: 16/247,730

(22) Filed: Jan. 15, 2019

(65) Prior Publication Data

US 2019/0292406 A1    Sep. 26, 2019

(30) Foreign Application Priority Data

Mar. 20, 2018 (KR) .......................... 10-2018-0032344

(51) Int. Cl.
*H01L 21/321* (2006.01)
*H01L 21/3105* (2006.01)
(Continued)

(52) U.S. Cl.
CPC .................. *C09G 1/02* (2013.01); *C09G 1/00* (2013.01); *C09G 1/04* (2013.01); *C09K 3/14* (2013.01); *C09K 3/1409* (2013.01); *C09K 3/1454* (2013.01); *C09K 3/1463* (2013.01); *H01L 21/302* (2013.01); *H01L 21/30625* (2013.01);
(Continued)

(58) Field of Classification Search
None
See application file for complete search history.

(56) References Cited

U.S. PATENT DOCUMENTS 6,540,935 B2    4/2003  Lee et al.
6,824,579 B2 *  11/2004 Ronay .................... C09G 1/02
                                                              106/3
(Continued)

FOREIGN PATENT DOCUMENTS

GN        107011805        8/2017
KR    10-2004-0098938 A   11/2004
(Continued)

OTHER PUBLICATIONS

Chinese Office Action for Chinese Patent Application No. or Patent No. 201910183579.2 dated May 8, 2021.

*Primary Examiner* — Stephanie P Duclair
(74) *Attorney, Agent, or Firm* — Kile Park Reed & Houtteman PLLC

(57) ABSTRACT

A polishing slurry includes an abrasive material, a first oxide polishing promoter, a first nitride polishing inhibitor, and a second nitride polishing inhibitor. The first oxide polishing promoter includes a polymer-based oxide polishing promoter. The first nitride polishing inhibitor includes an anionic nitride polishing inhibitor. The second nitride polishing inhibitor includes at least one selected from a cationic nitride polishing inhibitor and a non-ionic nitride polishing inhibitor.

14 Claims, 5 Drawing Sheets

(51) Int. Cl.
*H01L 21/306* (2006.01)
*H01L 21/302* (2006.01)
*C09K 3/14* (2006.01)
*C09G 1/04* (2006.01)
*C09G 1/02* (2006.01)
*C09G 1/00* (2006.01)
*B24B 37/04* (2012.01)

(52) U.S. Cl.
CPC .... *H01L 21/31053* (2013.01); *H01L 21/3212* (2013.01)

(56) References Cited

U.S. PATENT DOCUMENTS

| | | | | |
|---|---|---|---|---|
| 6,914,001 | B2* | 7/2005 | Lee | C09G 1/02 |
| | | | | 216/88 |
| 7,005,382 | B2* | 2/2006 | Nishimoto | C09G 1/02 |
| | | | | 106/3 |
| 9,567,490 | B2 | 2/2017 | Jung | |
| 2005/0164510 | A1* | 7/2005 | Ikeda | C09G 1/02 |
| | | | | 438/692 |
| 2011/0124195 | A1* | 5/2011 | Park | C09K 3/1463 |
| | | | | 438/693 |
| 2012/0270400 | A1* | 10/2012 | Takegoshi | H01L 21/76224 |
| | | | | 438/692 |
| 2013/0171824 | A1* | 7/2013 | Li | B24B 37/044 |
| | | | | 438/693 |
| 2017/0145259 | A1 | 5/2017 | Choo et al. | |

FOREIGN PATENT DOCUMENTS

| | | |
|---|---|---|
| KR | 10-2005-0060213 A | 6/2005 |
| KR | 10-1396250 B1 | 5/2014 |
| KR | 10-1409889 B1 | 6/2014 |
| KR | 10-2014-0087666 A | 7/2014 |
| KR | 10-2014-0087668 A | 7/2014 |
| KR | 10-2015-0024876 A | 3/2015 |
| KR | 10-2016-0125189 A | 10/2016 |
| KR | 10-1693278 B1 | 12/2016 |
| KR | 10-2017-0004462 A | 1/2017 |
| KR | 10-2017-0061643 A | 6/2017 |

* cited by examiner

POLISHING SLURRY AND METHOD OF POLISHING SUBSTRATE BY USING THE POLISHING SLURRY

CROSS-REFERENCE TO RELATED APPLICATION

Korean Patent Application No. 10-2018-0032344, filed on Mar. 20, 2018, in the Korean Intellectual Property Office, and entitled: "Polishing Slurry and Method of Polishing Substrate by Using the Polishing Slurry," is incorporated by reference herein in its entirety.

BACKGROUND

1. Field

Embodiments relate to a polishing slurry and a method of polishing a substrate by using the polishing slurry.

2. Description of the Related Art

As the size of semiconductor devices gradually decreases and the number of metal wiring layers gradually increases, the surface irregularity in each layer is transferred to the next layer such that the bending degree of the lowermost layer surface becomes important. Here, such bending may cause an effect that is so significantly adverse that a photolithography process is not able to be performed. Therefore, to improve the yield of semiconductor devices, a planarization process for eliminating irregular surface bending that occurs in various process steps may be used. Examples of the planarization method include a reflow process after formation of a thin film, an etch back process after formation of a thin film, and a chemical-mechanical polishing (CMP) process.

The term "CMP polishing process" refers to a process of polishing a surface smoothly by providing a slurry containing an abrasive material and various compounds while rotating a semiconductor wafer surface in contact with a polishing pad. That is, a surface of a substrate or an upper layer thereof is chemically and mechanically polished by using a slurry and a polishing pad.

SUMMARY

Embodiments are directed to a polishing slurry including an abrasive material, a first oxide polishing promoter, a first nitride polishing inhibitor, and a second nitride polishing inhibitor. The first oxide polishing promoter includes a polymer-based oxide polishing promoter. The first nitride polishing inhibitor includes an anionic nitride polishing inhibitor. The second nitride polishing inhibitor includes at least one selected from a cationic nitride polishing inhibitor and a non-ionic nitride polishing inhibitor.

The polymer-based oxide polishing promoter may include a sulfonate-containing anionic polymer material.

The polymer-based oxide polishing promoter may include at least one selected from poly-(sodium 4-styrenesulfonate), poly(vinylsulfonic acid), polynaphthalene sulfonate, and poly(3,4-ethylenedioxythiophene).

The polishing slurry may further include a second oxide polishing promoter that is different from the first oxide polishing promoter.

The polishing slurry may further include a second oxide polishing promoter including an alkanolamine-based monomolecular material containing a hydroxyl group and an amine group.

The polishing slurry may further include a second oxide polishing promoter including at least one selected from aminomethyl propanol, ethanolamine, heptaminol, isoetharine, methanolamine, diethylethanolamine, and N-methylethanolamine.

The first nitride polishing inhibitor may include a carboxyl group-containing anionic material.

The first nitride polishing inhibitor may include at least one selected from poly(acrylic acid) (PAA), poly(alkyl methacrylate), acrylamide, methacrylamide, and ethylmethacrylamide.

The second nitride polishing inhibitor may include at least one selected from polyoxyethylene stearyl amine ether, polysorbate, octoxynol, polyethylene glycol, octadecyl ether, nonylphenol ethoxylate, polyoxyl castor oil, ethylene oxide, glycolic acid, and glycerol ethoxylate.

An amount of the first oxide polishing promoter may be in a range of about 0.004 weight % to about 0.03 weight % based on the total weight of the polishing slurry.

An amount of the first oxide polishing promoter may be in a range of about 0.004 weight % to about 0.02 weight % based on the total weight of the polishing slurry.

An amount of the second oxide polishing promoter may be in a range of about 0.01 weight % to about 1.35 weight % based on the total weight of the polishing slurry.

An amount of the first nitride polishing inhibitor may be in a range of about 0.01 weight % to about 0.08 weight % based on the total weight of the polishing slurry.

An amount of the second nitride polishing inhibitor may be in a range of about 0.002 weight % to about 0.02 weight % based on the total weight of the polishing slurry.

The abrasive material may include ceria ($CeO_2$).

An amount of the abrasive material may be in a range of about 0.1 weight % to about 10 weight % based on the total weight of the polishing slurry.

The polishing slurry may further include a dispersing agent that disperses the abrasive material.

The polishing slurry may have a polishing selectivity ratio of oxides to nitrides in a range of about 30:1 to about 300:1.

Embodiments are also directed to a method of polishing a substrate. The method includes preparing a substrate on which a nitride film and an oxide film are formed, the oxide film being formed on a surface of the substrate, and polishing the oxide film on the surface of the substrate by supplying a polishing slurry to the substrate. The polishing slurry includes an abrasive material, a first oxide polishing promoter, a first nitride polishing inhibitor, and a second nitride polishing inhibitor. The first oxide polishing promoter includes a polymer-based oxide polishing promoter. The first nitride polishing inhibitor includes an anionic nitride polishing inhibitor. The second nitride polishing inhibitor includes at least one selected from a cationic nitride polishing inhibitor and a non-ionic nitride polishing inhibitor.

Preparing the substrate may include forming a pattern on the substrate, forming the nitride film on the pattern, and forming the oxide film on the nitride film.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
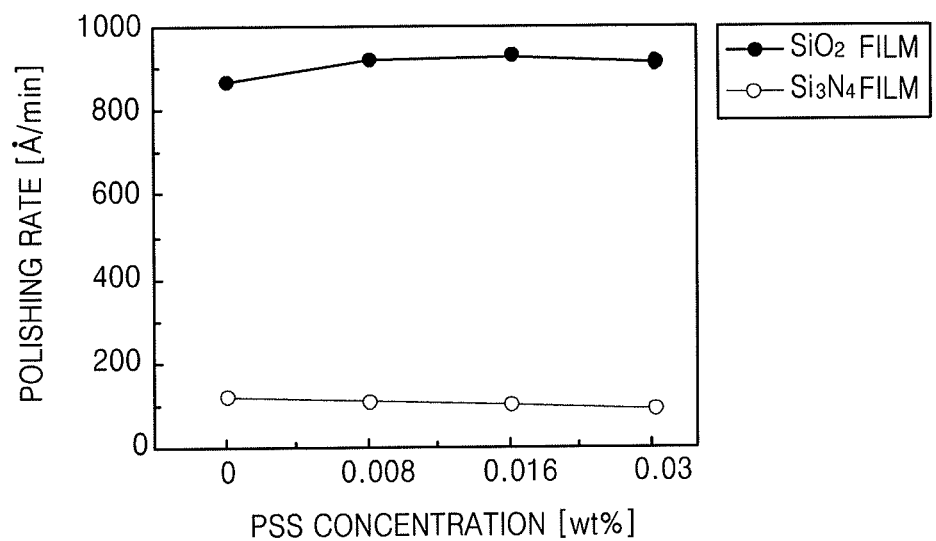
FIG. 1 illustrates a graph showing polishing rates of an oxide and a nitride according to a concentration of a first oxide polishing promoter.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

According to an embodiment, a polishing slurry may include an abrasive material, a first oxide polishing promoter, a first nitride polishing inhibitor, and a second nitride polishing inhibitor.

The first oxide polishing promoter may include a polymer-based oxide polishing promoter. The first nitride polishing inhibitor may include an anionic nitride polishing inhibitor. The second nitride polishing inhibitor may include at least one selected from a cationic nitride polishing inhibitor and a non-ionic nitride polishing inhibitor.

The polishing slurry may further include a second oxide polishing promoter that is different from the first oxide polishing promoter.

The polishing slurry may be used to polish an oxide film, for example, a silicon oxide ($SiO_x$) layer.

The polishing slurry may further include a dispersing agent to disperse the abrasive material. The polishing slurry may further include at least one of a dispersion stabilizer and pH adjustor.

The abrasive material, the first oxide polishing promoter, the first nitride polishing inhibitor, and the second nitride polishing inhibitor that are included in the polishing slurry may be contained in a solution. For example, the abrasive material, the first oxide polishing promoter, the first nitride polishing inhibitor, and the second nitride polishing inhibitor may be dispersed and distributed in water, such as deionized (DI) water.

To adjust a pH of the polishing slurry, the polishing slurry may further include a pH adjustor. The polishing slurry further including a pH adjustor may be a liquid in which an abrasive material is dispersed. An amount of each component is appropriately controlled.

The abrasive material may be at least one metal oxide selected from silica ($SiO_2$), ceria ($CeO_2$), alumina ($Al_2O_3$), titania ($TiO_2$), zirconia ($ZrO_2$), and germania ($GeO_2$). For example, the abrasive material may include ceria ($CeO_2$) having a high polishing selectivity ratio of the oxide.

Abrasive particles constituting the abrasive material may be analyzed by X-ray diffraction to define a crystal structure of the abrasive particles. The abrasive particles may be analyzed to define a wet ceria-like crystal structure with a polyhedral crystal plane.

An amount of the abrasive material may be in a range of about 0.1 weight % to about 10 weight % based on the total weight of the polishing slurry. For example, the amount of the abrasive material may be in a range of about 0.3 weight % to about 3 weight % based on the total weight of the polishing slurry. When the amount of the abrasive material is about 0.1 weight % or more, a target film to be polished may be sufficiently polished. When, the amount of the abrasive material is about 10 weight % or less, a lowering of the dispersion stability of the polishing slurry, which could result in the occurrence of scratches on the surface of a polishing-stopping film may be avoided.

An average particle diameter of the abrasive particles may be in a range of about 6 nm to about 350 nm. For example, the average particle diameter of the abrasive particles may be in a range of about 20 nm to about 100 nm. When the average particle diameter of the abrasive particles is about 6 nm or more, a target film to be polished may be polished well at a sufficient polishing rate. When the average particle diameter of the abrasive particles is about 350 nm or less, micro-scratches that could occur on a target polishing film may be avoided. Therefore, the abrasive particles may have an average particle diameter within a range that does not cause micro-scratches on a polish-stopping film without lowering a polishing rate for a target polishing film.

The dispersing agent may be a material that prevents aggregation of the abrasive particles in the polishing slurry and that evenly disperses the abrasive particles in the polishing slurry. The dispersing agent may control the zeta potential of the abrasive material. For example, a cationic dispersing agent may increase the zeta potential of the abrasive material to a positive value, and an anionic dispersing agent may reduce the zeta potential of the abrasive material to a negative value.

The dispersing agent may include an anionic-based low-molecular weight material, a cationic-based polymer material, hydroxy acid, or amino acid.

The anionic-based low-molecular weight material may include at least one of oxalic acid, citric acid, polysulfonic acid, poly(acrylic acid), poly(methacrylic acid) (Darvan® C—N), and a salt thereof, or may include a copolymer acid.

The cationic-based polymer material may include at least one selected from polylysine, polyethyleneimine, benzethonium chloride, Bronidox, cetrimonium bromide, cetrimonium chloride, dimethyldioctadecylammonium bromide, tetramethylammonium hydroxide, distearyldimethylammonium chloride, a polymer of dimethylamine and epichlorohydrin, 1,2-dioleoyl-3-trimethylammonium-propane, and poly(arylamine).

The hydroxy acid may include at least one selected from hydroxybenzoic acid, ascorbic acid, and a salt thereof.

The amino acid may include at least one selected from picolinic acid, glutamic acid, tryptophan, aminobutyric acid, and a salt thereof.

An amount of the dispersing agent may be in a range of about 0.01 weight % to about 0.1 weight % based on the total weight of the polishing slurry. For example, the amount of the dispersing agent may be in a range of about 0.02 weight % to about 0.06 weight % based on the total weight of the polishing slurry. When the amount of the dispersing agent is about 0.01 weight % or more, the dispersion stability of the abrasive material may be sufficiently secured and precipitation of the abrasive material may be avoided. When the amount of the dispersing agent is about 0.1 weight % or less, aggregation of the polymer material and an increase in ionization concentration may be avoided, and sufficient dispersion stability may be provided.

The dispersion stabilizer may be adsorbed onto ceria particles in the polishing slurry, thereby increasing the absolute value of the zeta potential of the abrasive material and aiding the dispersion of the abrasive material. By a pH buffering action, the dispersion stabilizer may inhibit chemical changes of the polishing slurry that could be caused by external variable factors, thereby preventing the aggregation of the abrasive particles, so as to evenly disperse the abrasive particles. The dispersion stabilizer may include an organic acid having a carboxyl group. Among organic acids, alpha-amino acid in which a carboxyl group and an amine group are bonded to the same carbon atom (C) may be included. Alpha-amino acids may be classified into neutral amino acids, acidic amino acids, and basic amino acids, depending on the number of carboxyl groups and an amine groups. Examples of neutral amino acids include alanine, glycine, tyrosine, and valine, which have the same number of amine groups and hydroxyl groups. Examples of acidic amino acids include aspartic acid, glutamic acid, and citric acid, which have more carboxyl groups than amine groups. An example of the basic amino acid is lysine, which has more amine groups than carboxyl groups.

An amount of the dispersion stabilizer may be in a range of about 0.0001 weight % to about 0.1 weight % based on the total weight of the polishing slurry. For example, the amount of the dispersion stabilizer may be in a range of about 0.001 weight % to about 0.01 weight %. When the amount of the dispersion stabilizer is about 0.0001 weight % or more, the dispersion stabilizer may have a sufficient pH buffer capacity, and insufficient effects of the dispersion stabilizer resulting from a low pH may be avoided. When the amount of the dispersion stabilizer is 0.1 weight % or less, the dispersion stability of the polishing slurry may be sufficient.

The first oxide polishing promoter may promote polishing of a target material to be polished. For example, by using the polishing promoter, the polishing of a target material to be polished may be promoted while the polishing of materials other than the target material to be polished may be inhibited. Thereby, a polishing selectivity ratio of the target material may be controlled. For example, when an oxide is polished, the polishing promoter may promote the polishing of the oxide, but inhibit the polishing of a nitride other than the oxide, thereby controlling a polishing selectivity ratio of each of the oxide and the nitride.

The first oxide polishing promoter may include a polymer-based oxide polishing promoter. The polymer-based oxide polishing promoter may include a sulfonate-containing anionic polymer material.

The first oxide polishing promoter may include at least one of poly-(sodium 4-styrenesulfonate), poly(vinylsulfonic acid), poly-naphthalene sulfonate, and poly(3,4-ethylenedioxythiophene).

An amount of the first oxide polishing promoter may be in a range of about 0.004 weight % to about 0.03 weight % based on the total weight of the polishing slurry. For example, the amount of the first oxide polishing promoter may be in a range of about 0.012 weight % to about 0.02 weight % based on the total weight of the polishing slurry.

For example, the amount of the first oxide polishing promoter may be in a range of about 0.004 weight % to about 0.03 weight % based on the total weight of the polishing slurry. When the amount of the first oxide polishing promoter is greater than about 0.016 weight %, a polishing rate for the target material to be polished, i.e., the oxide, tends to decrease. When the amount of the first oxide polishing promoter is about 0.016 weight % or less, a decrease in the polishing rate for the target material to be polished, i.e., the oxide, may be avoided.

The polishing slurry may further include a second oxide polishing promoter that is different from the first oxide polishing promoter. The second oxide polishing promoter may promote the polishing of the target material to be polished. For example, when an oxide is polished, the second polishing promoter may promote the polishing of the oxide, but inhibit the polishing of a nitride other than the oxide, thereby controlling a polishing selectivity ratio of each of the oxide and the nitride.

The second oxide polishing promoter may include an alkanolamine-based monomolecular material having a hydroxyl group (OH) and an amine group.

The alkanolamine-based monomolecular material may have an absolute value of a dissociation constant, pKa, of 9.7 (based on the amine group), resulting in dissociation into $NH_3^+$ in a solution having a pH of 9.7 or less. Consequently, the alkanolamine-based monomolecular material may have a positive charge value. $NH_3^+$ having a positive charge may act on an oxide film having a negative charge such that a reaction of the oxide film to form $Si(OH)_4$ may be promoted, thereby increasing a polishing rate for the oxide film.

Examples of an alkanolamine-based monomolecular material having a hydroxyl group (OH) and an amine group that may be used as a second oxide polishing promoter may include aminomethylpropanol (AMP), ethanolamine, heptaminol, isoetharine, methanolamine, diethylethanolamine, N-methylethanolamine, or combinations thereof.

An amount of the second oxide polishing promoter may be in a range of about 0.01 weight % to about 1.35 weight % based on the total weight of the polishing slurry. For example, the amount of the second oxide polishing promoter may be in a range of about 0.5 weight % to about 1.0 weight % based on the total weight of the polishing slurry. When the amount of the second oxide polishing promoter is about 0.01 weight % or more, the polishing rate increment of the oxide film is sufficient, and a failure of achieving an optimal polishing selectivity ratio between the oxide film and a nitride film may be avoided. When the amount of the second oxide polishing promoter is about 1 weight % or less, a lowering of the dispersion stability of the polishing slurry due to a high concentration of the polishing promoter may be avoided.

The first nitride polishing inhibitor may be included in the polishing slurry, and may inhibit the polishing of materials other than a target material to be polished. For example, the polishing of a nitride may be inhibited, thereby controlling a polishing selectivity ratio of the nitride.

The first nitride polishing inhibitor may include an anionic nitride polishing inhibitor.

The first nitride polishing inhibitor may include a carboxyl group-containing anionic material. The first nitride polishing inhibitor including a carboxyl group-containing anionic material may have an absolute value of a dissociation constant, pKa, of about 4.5, resulting in dissociation of hydrogen ions in a solution having a pH of 4.5 or more. Consequently, the first nitride polishing inhibitor may be present in the form of $COO^-$ having a negative charge value.

The first nitride polishing inhibitor may include at least one selected from poly(acrylic acid) (PAA), poly(alkyl methacrylate), acrylamide, methacrylamide, and ethylmethacrylamide.

An amount of the first nitride polishing inhibitor may be in a range of about 0.01 weight % to about 0.08 weight % based on the total weight of the polishing slurry. For example, the amount of the first nitride polishing inhibitor may be in a range of about 0.02 weight % to about 0.08 weight % based on the total weight of the polishing slurry. When the amount of the first nitride polishing inhibitor is less than about 0.01 weight %, a the polishing rate for a nitride film is increased, which could result in failure of achieving a high polishing selectivity ratio between the oxide film to the nitride film.

The polishing slurry may include a second nitride polishing inhibitor that is different from the first nitride polishing inhibitor. The second nitride polishing inhibitor may inhibit the polishing of materials other than a target material to be polished. For example, the polishing of each of the materials other than the target material may be inhibited, thereby controlling a polishing selectivity ratio of each of the materials.

The second nitride polishing inhibitor may include at least one selected from a cationic nitride polishing inhibitor and a non-ionic nitride polishing inhibitor.

The cationic nitride polishing inhibitor may include a polyethyelene glycol (PEG)-based cationic polymer material having a hydrocarbon chain. Such a cationic polymer material may form an interpolymer complex or a bond with the first nitride polishing inhibitor, which is an anionic polymer material that may be included in the polishing slurry, by a van der Waals force or ionic attraction, thereby providing high polishing inhibiting characteristics of the nitride film by facilitating the absorption of the first nitride polishing inhibitor to the nitride film.

The non-ionic nitride polishing inhibitor may have an excellent bonding strength to a nitride rather than to an oxide. The non-ionic nitride polishing inhibitor may be a non-ionic material having both a hydrophobic group and a hydrophilic group.

The cationic nitride polishing inhibitor may include polyoxyethylene stearyl amine ether (PSAE). The non-ionic nitride polishing inhibitor may include at least one selected from polysorbate, octoxynol, polyethyleneglycol, octadecyl ether, nonylphenol ethoxylate, polyoxyl castor oil, ethylene oxide, glycolic acid, and glycerol ethoxylate.

The pH adjustor may be included in the polishing slurry to adjust the pH of the polishing slurry. Examples of the pH adjustor may include nitric acid ($HNO_3$), ammonia water ($NH_4OH$), sodium hydroxide (NaOH), and potassium hydroxide (KOH). The pH adjustor may be used to adjust the pH of the polishing slurry to a range between about 3 to about 10. For example, the pH of the polishing slurry may be adjusted to a range between about 5 to about 8.

In an embodiment, the polishing slurry may have a polishing selectivity ratio of the oxide to the nitride in a range of about 30:1 to about 300:1, for example, about 40:1 to about 300:1. A polishing rate for the polishing slurry with respect to the oxide may be maintained in a range of about 600 Å/min to about 900 Å/min, and a polishing rate for the polishing slurry with respect to the nitride may be maintained in a range of greater than 0 Å/min to about 30 Å/min.

The polishing slurry according to an embodiment may be used for a polishing process on an oxide in a manufacturing process of a semiconductor device. For example, in the process of manufacturing a thin film transistor, the polishing slurry may be used for a polishing process using a silicon nitride film as a polishing-stopping film to form an interlayer dielectric (ILD) film, and a silicon oxide film as a target film to be polished on the silicon nitride film.

In the process of manufacturing a semiconductor device, a structure having a height difference may be formed when a pattern is formed on a substrate. Thus, when an ILD layer is formed on the substrate with a pattern formed thereon, a slurry having an appropriate polishing selectivity ratio depending on a pattern to be polished and types of a polishing-stopping film may be selected to perform a polishing process. For example, to not only provide a high polishing rate to a silicon oxide film, but to also stop or inhibit the polishing at a silicon nitride film, a polishing slurry having an optimal range of an oxide-to-nitride polishing selectivity ratio may be used in the process of manufacturing a semiconductor device.

Embodiments provide a method of polishing a substrate, including preparing a substrate on which a nitride film and an oxide film are formed such that the oxide film is formed on a surface of the substrate and polishing the oxide film on the surface of the substrate by supplying the polishing slurry according to an embodiment to the substrate.

The preparing of the substrate may include forming a pattern on the substrate, forming the nitride film on the pattern, and forming the oxide film on the nitride film.

The polishing selectivity ratio of the oxide film to the nitride film may be maintained between about 30:1 and about 300:1. A polishing rate of the oxide film may be greater than that of the nitride film.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Preparation Examples 1 to 36

A polishing slurry was prepared by mixing 1 weight % of wet ceria as an abrasive particle, 0.03 weight % of Darvan® C—N as a dispersing agent, 0.004 weight % of citric acid as a dispersion stabilizer, poly-(sodium 4-styrenesulfonate) (PSS) as a first oxide polishing promoter, aminomethylpropanol (AMP) as a second oxide polishing promoter, poly (acrylic acid) (PAA) as a first nitride polishing inhibitor, and polyoxyethylene stearyl amine ether (PSAE) as a second nitride polishing inhibitor. Then, the polishing slurry was adjusted with nitric acid to have a pH of 6. The first oxide polishing promoter, the second oxide polishing promoter, the first nitride polishing inhibitor, and the second nitride polishing inhibitor were used in the weight ratios shown in Table 1.

TABLE 1

| Preparation Example | Oxide polishing promoter | | Nitride polishing inhibitor | |
|---|---|---|---|---|
| | PSS [wt %] | AMP [wt %] | PAA [wt %] | PSAE [wt %] |
| 1 | 0 | | | |
| 2 | 0.008 | | | |
| 3 | 0.016 | | | |

TABLE 1-continued

| Preparation Example | Oxide polishing promoter | | Nitride polishing inhibitor | |
|---|---|---|---|---|
| | PSS [wt %] | AMP [wt %] | PAA [wt %] | PSAE [wt %] |
| 4 | 0.03 | | | |
| 5 | | 0 | | |
| 6 | | 0.06 | | |
| 7 | | 0.12 | | |
| 8 | | 0.18 | | |
| 9 | | 0.24 | | |
| 10 | 0 | | 0.04 | 0.002 |
| 11 | 0.008 | | 0.04 | 0.002 |
| 12 | 0.016 | | 0.04 | 0.002 |
| 13 | 0.03 | | 0.04 | 0.002 |
| 14 | | 0 | 0.04 | 0.002 |
| 15 | | 0.06 | 0.04 | 0.002 |
| 16 | | 0.12 | 0.04 | 0.002 |
| 17 | | 0.18 | 0.04 | 0.002 |
| 18 | | 0.24 | 0.04 | 0.002 |
| 19 | | | 0 | |
| 20 | | | 0.01 | |
| 21 | | | 0.02 | |
| 22 | | | 0.04 | |
| 23 | | | 0.06 | |
| 24 | | | 0.08 | |
| 25 | | | 0.04 | 0 |
| 26 | | | 0.04 | 0.001 |
| 27 | | | 0.04 | 0.002 |
| 28 | | | 0.04 | 0.004 |
| 29 | 0 | 0.18 | 0.04 | 0.002 |
| 30 | 0.004 | 0.18 | 0.04 | 0.002 |
| 31 | 0.008 | 0.18 | 0.04 | 0.002 |
| 32 | 0.012 | 0.18 | 0.04 | 0.002 |
| 33 | 0.016 | 0.18 | 0.04 | 0.002 |
| 34 | 0.02 | 0.18 | 0.04 | 0.002 |
| 35 | 0.03 | 0.18 | 0.04 | 0.002 |
| 36 | 0.1 | 0.18 | 0.04 | 0.002 |

Preparation Examples 37 to 40

1 weight % of 70 nm wet ceria as an abrasive particle, 0.03 weight % of Darvan® C—N as a dispersing agent, and 0.004 weight % of citric acid as a dispersion stabilizer were mixed with deionized (DI) water. $HNO_3/NH_4OH$ which served as a pH adjustor was added to the mixture at a constant rate, thereby obtaining a polishing slurry having a pH of 4, 6, 8, and 10, respectively.

Experimental Example 1: Measurement of Polishing Rate and Polishing Selectivity Ratios According to Polishing Slurry Compositions By using the polishing slurries prepared according to Preparation Examples 1 to 36, a polishing device (Poli-300, manufactured by G&P Technology), and a polishing pad (Suba-800), an oxide film ($SiO_2$ film) and a nitride film ($Si_3N_4$ film) were each polished at a rotating speed of about 80/80 rpm (head/pad). The polishing rate for and the polishing selectivity ratio of the oxide film to the nitride film using the polishing slurries of Preparation Examples 1 to 36 are shown in Table 2.

TABLE 2

| Preparation Example | $SiO_2$ film polishing rate [Å/min] | $Si_3N_4$ film polishing rate [Å/min] | Polishing selectivity ratio [$SiO_2$:$Si_3N_4$] |
|---|---|---|---|
| 1 | 870 | 117 | 7:1 |
| 2 | 924 | 105 | 9:1 |
| 3 | 930 | 99 | 9:1 |
| 4 | 917 | 92 | 10:1 |
| 5 | 870 | 117 | 7:1 |
| 6 | 906 | 121 | 7:1 |
| 7 | 933 | 110 | 8:1 |
| 8 | 951 | 113 | 8:1 |
| 9 | 948 | 108 | 9:1 |
| 10 | 678 | 21 | 32:1 |
| 11 | 691 | 22 | 31:1 |
| 12 | 694 | 19 | 37:1 |
| 13 | 690 | 20 | 35:1 |
| 14 | 678 | 19 | 35:1 |
| 15 | 693 | 19 | 36:1 |
| 16 | 711 | 18 | 39:1 |
| 17 | 737 | 20 | 36:1 |
| 18 | 742 | 19 | 39:1 |
| 19 | 870 | 117 | 7:1 |
| 20 | 831 | 77 | 11:1 |
| 21 | 753 | 59 | 12:1 |
| 22 | 693 | 34 | 20:1 |
| 23 | 610 | 32 | 19:1 |
| 24 | 551 | 30 | 18:1 |
| 25 | 693 | 34 | 20:1 |
| 26 | 674 | 28 | 24:1 |
| 27 | 678 | 21 | 32:1 |
| 28 | 655 | 20 | 32:1 |
| 29 | 737 | 20 | 36:1 |
| 30 | 749 | 17 | 44:1 |
| 31 | 771 | 18 | 42:1 |
| 32 | 790 | 16 | 49:1 |
| 33 | 808 | 15 | 54:1 |
| 34 | 781 | 15 | 52:1 |
| 35 | 711 | 16 | 44:1 |
| 36 | 428 | 13 | 33:1 |

Figure 2:
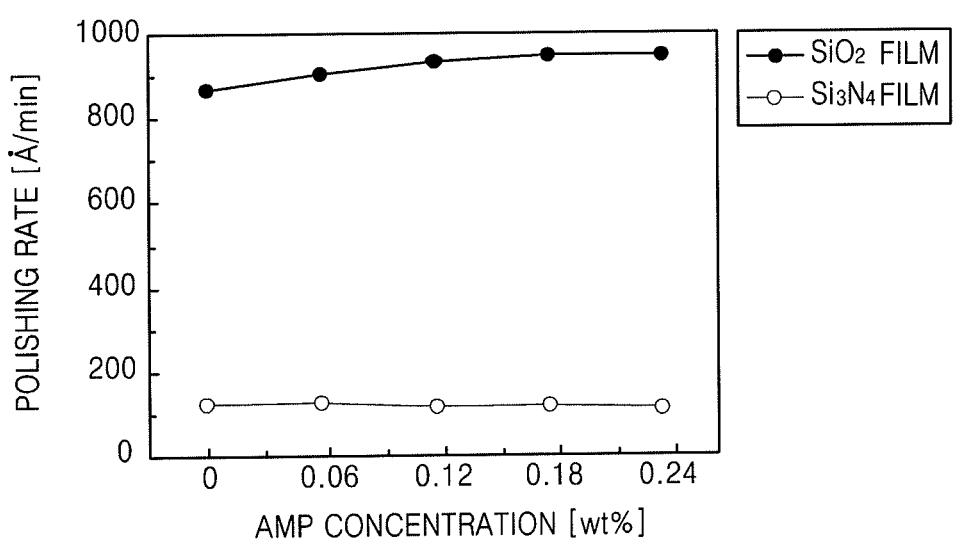
FIG. 2 illustrates a graph showing polishing rates of an oxide and a nitride according to a concentration of a second oxide polishing promoter.
Figure 3:
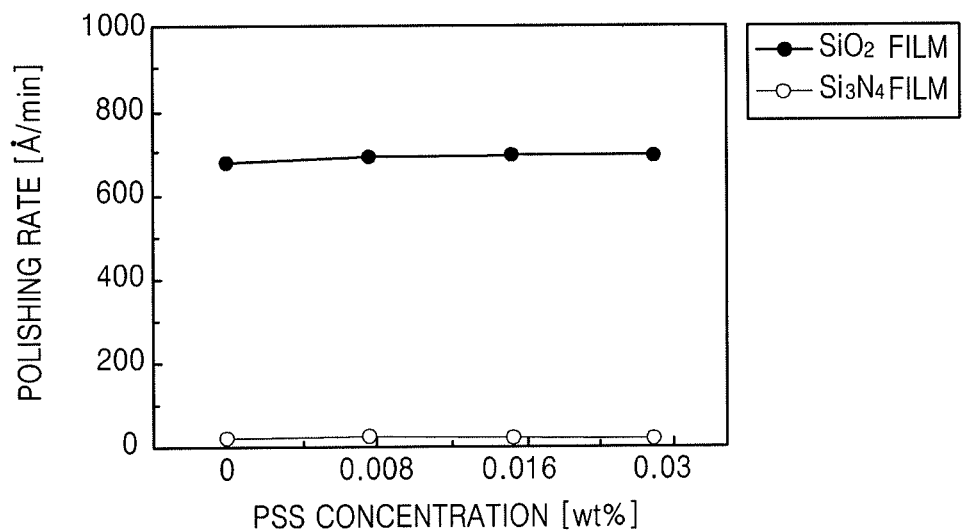
FIG. 3 illustrates a graph showing polishing rates of an oxide and a nitride of an embodiment according to a concentration of a first oxide polishing promoter.
Figure 4:
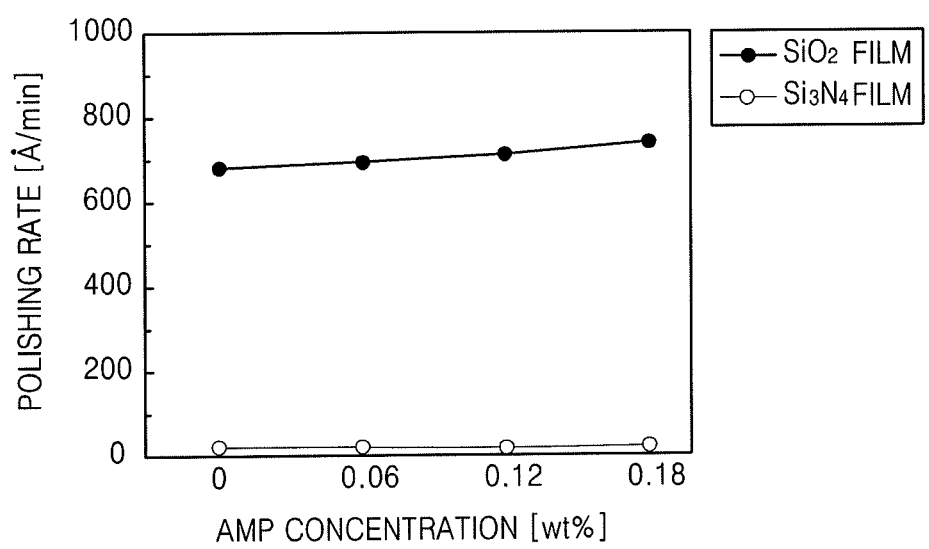
FIG. 4 illustrates a graph showing polishing rates of an oxide and a nitride according to a concentration of a second oxide polishing promoter.
Figure 5:
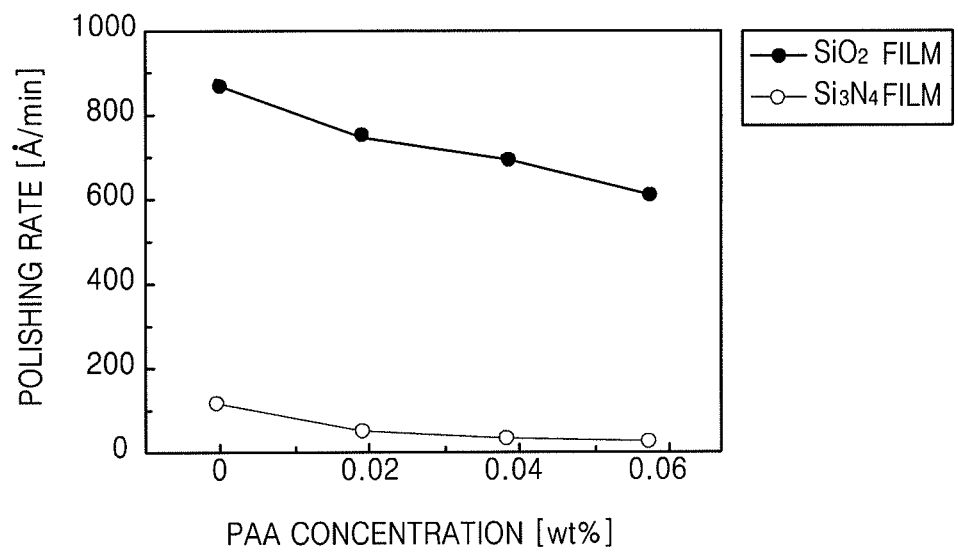
FIG. 5 illustrates a graph showing polishing rates of an oxide and a nitride according to a concentration of a first nitride polishing inhibitor.
Figure 6:
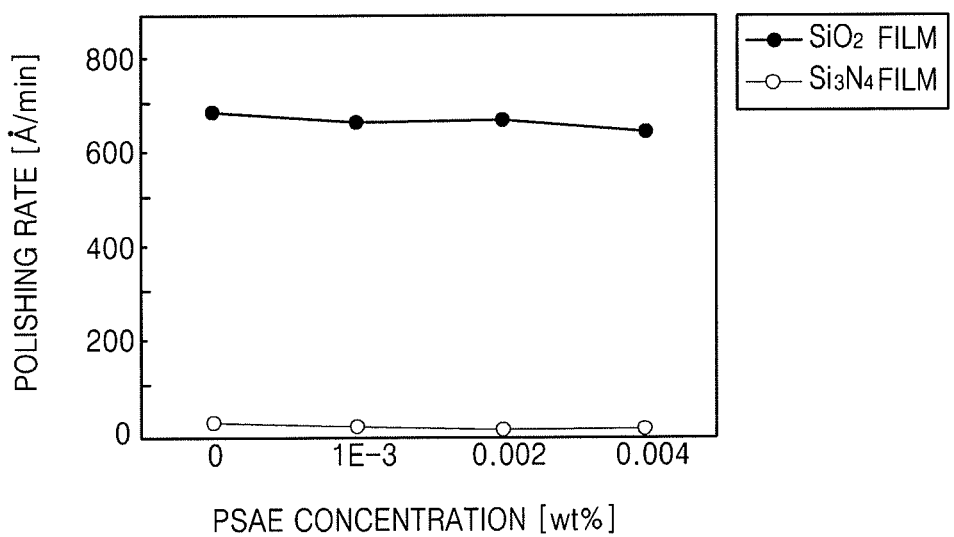
FIG. 6 illustrates a graph showing polishing rates of an oxide and a nitride according to a concentration of a second nitride polishing inhibitor.
Figure 7:
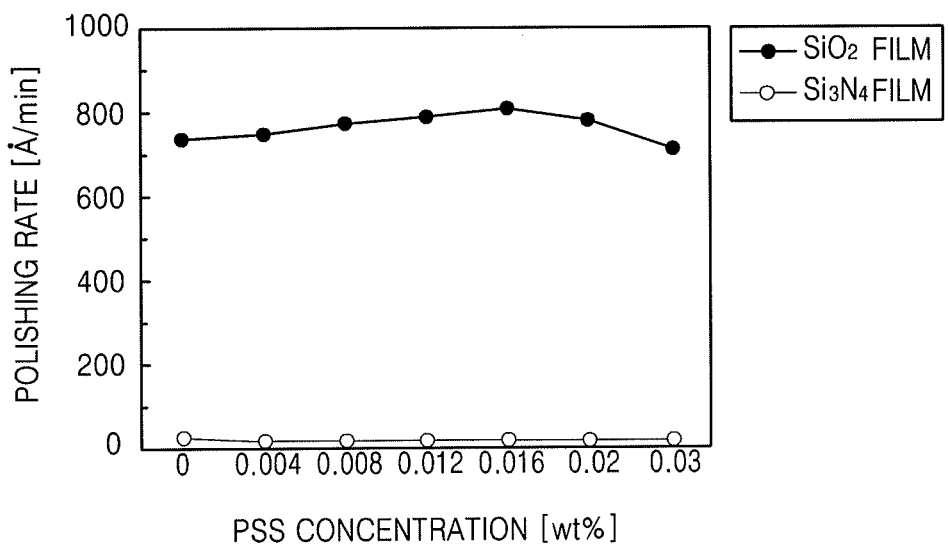
FIG. 7 illustrates a graph showing polishing rates of an oxide and a nitride according to a concentration of a first oxide polishing promoter.

FIG. 1 illustrates a graph showing the polishing rate for an oxide and a nitride according to a concentration of the first oxide polishing promoter when the polishing slurries of Preparation Examples 1 to 4 including the first oxide polishing promoter only were used. FIG. 2 illustrates a graph showing the polishing rate for an oxide and a nitride according to a concentration of the second oxide polishing promoter when the polishing slurries of Preparation Examples 5 to 9 including the second oxide polishing promoter only were used. FIG. 3 illustrates a graph showing the polishing rate for an oxide and a nitride according to a concentration of the first oxide polishing promoter when the polishing slurries of Preparation Examples 10 to 13 according to an embodiment were used. FIG. 4 illustrates a graph showing the polishing rate for an oxide and a nitride according to a concentration of the second oxide polishing promoter when the polishing slurries of Preparation Examples 14 to 18 were used. FIG. 5 illustrates a graph showing the polishing rate for an oxide and a nitride according to a concentration of the first nitride polishing inhibitor when the polishing slurries of Preparation Examples 19 to 24 including the first nitride polishing inhibitor only were used. FIG. 6 illustrates a graph showing the polishing rate for an oxide and a nitride according to a concentration of the second nitride polishing inhibitor when the polishing slurries of Preparation Examples 35 to 28 including the first nitride polishing inhibitor and the second nitride polishing inhibitor only were used. FIG. 7 illustrates a graph showing the polishing rate for an oxide and a nitride according to a concentration of the first oxide polishing promoter when the polishing slurries of Preparation Examples 29 to 26 according to an embodiment including the first oxide polishing promoter at various concentrations.

Referring to FIG. 1, it can be seen that as the amount of the first oxide polishing promoter was increased, the polishing rate for the silicon nitride was slightly reduced while the polishing rate for the silicon oxide was increased. When the amount of the first oxide polishing promoter in the polishing slurry was about 0.03 weight %, the polishing selectivity ratio of the oxide to nitride was about 10, which is higher than the case where the polishing selectivity ratio of the silicon oxide to the silicon nitride was about 7 when the amount of the first oxide polishing promoter in the polishing slurry was about 0 weight %. In addition, referring to FIG. 3, it can be seen that when the amount of the first oxide polishing promoter was about 0.016 weight %, the amount of the first nitride polishing inhibitor was about 0.04 weight %, and the amount of the second nitride polishing inhibitor was about 0.002 weight %, the polishing selectivity ratio of the oxide to the nitride was about 37, which was higher than in the case where the selectivity ratio of the oxide to the nitride was about 32 when the amount of the first oxide polishing promoter was about 0 weight %. Thus, when the first oxide polishing promoter was used, the polishing slurry could be adjusted to have a high selectivity ratio by improving the polishing selectivity ratio of the oxide to the nitride.

Referring to FIG. 2, it can be seen that as the amount of the second oxide polishing promoter was increased, the polishing rate for the silicon nitride remained relatively constant while the polishing rate for the silicon oxide was increased. When the amount of the second oxide polishing promoter was about 0.24 weight %, the polishing selectivity ratio of the oxide to nitride was about 9, which is higher than the case where the polishing selectivity ratio of the silicon oxide to the silicon nitride was about 7 when the amount of the second oxide polishing promoter was about 0 weight %. In addition, referring to Tables 1 and 2, it can be seen that when the amount of the second oxide polishing promoter was about 0.24 weight %, the amount of the first nitride polishing inhibitor was about 0.04 weight %, and the amount of the second nitride polishing inhibitor was about 0.002 weight %, the polishing selectivity ratio of the oxide to nitride was about 39, which is higher than in the case where the polishing selectivity ratio of the silicon oxide to the silicon nitride was about 35 when the amount of the first oxide polishing promoter was about 0 weight %. Thus, when the second oxide polishing promoter was used, the polishing slurry could be adjusted to have a high selectivity ratio by improving the polishing selectivity ratio of the oxide to the nitride.

Referring to FIG. 5, it can be seen that as the amount of the first nitride polishing inhibitor was increased, the polishing rate for the silicon nitride was reduced and the polishing rate for the silicon oxide was also reduced. Here, it can be seen that the reduction in the polishing rate for the silicon nitride was larger than the reduction in the polishing rate for the silicon oxide, resulting in the increase in the polishing selectivity ratio of the oxide to the nitride. Thus, when the first nitride polishing inhibitor was used, the polishing slurry could be adjusted to have a high selectivity ratio by improving the polishing selectivity ratio of the oxide to the nitride.

Referring to FIG. 6, it can be seen that as the amount of the second nitride polishing inhibitor was increased, the polishing rate for the silicon nitride was reduced and the polishing rate for the silicon oxide was also reduced. Here, it can be seen that the reduction in the polishing rate for the silicon nitride was larger than that in the polishing rate for the silicon oxide, resulting in the increase in the polishing selectivity ratio of the oxide to the nitride. In addition, the polishing rate for the nitride was more significantly reduced when the second nitride polishing inhibitor was used together with the first nitride polishing inhibitor (for the preparation of the slurries of Preparation of Examples 25 to 28), as compared with the case where only the first nitride polishing inhibitor was used (for the preparation of the slurries of Preparation of Examples 19 to 24). In addition, the significant increase in the polishing selectivity ratio of the oxide to the nitride was also confirmed.

Comparing the cases of using the polishing slurries of Preparation Examples 1 to 4 with the cases of using the polishing slurries of Preparation Examples 10 to 13, it may be confirmed that the polishing rate for the nitride was significantly reduced when the first nitride polishing inhibitor and the second nitride polishing inhibitor were used, as compared with the case where the nitride polishing inhibitor was not used. When the amount of the first oxide polishing promoter was about 0.03 weight %, the amount of the first nitride polishing inhibitor was about 0.04 weight %, and the amount of the second nitride polishing inhibitor was about 0.002 weight %, the polishing selectivity ratio of the oxide to the nitride was about 35, which is significantly higher than in the case where the polishing selectivity ratio of the oxide to the nitride was about 10 when the amount of the first oxide polishing promoter was about 0.03 weight % and the nitride polishing inhibitor was not used. Thus, the polishing slurry may be adjusted to have a high selectivity ratio in terms of the polishing selectivity ratio of the oxide to the nitride by using the nitride polishing inhibitor.

As shown in FIG. 7, as the amount of the first oxide polishing promoter was increased, the polishing rate for the silicon oxide was increased to a certain level. However, it can be seen that when the amount of the first oxide polishing promoter was greater than about 0.016 weight %, the polishing rate for the silicon oxide was reduced. When the amount of the first oxide polishing promoter was about 0.1 weight %, the polishing rate for the oxide was about 2 times lower than in the case where the amount of the first oxide polishing promoter was about 0.016 weight %. For example, it may be confirmed that when the amount of the first oxide polishing promoter was greater than about 0.016 weight %, the polishing rate for the oxide, which is a target material to be polished, tended to be reduced.

Experimental Example 2: Measurement of Polishing Rate and Polishing Selectivity Ratios According to pH Control in Polishing Slurry By using the polishing slurries prepared according to Preparation Examples 37 to 40, a polishing device (Poli-300, manufactured by G&P Technology), and a polishing pad (Suba-800), an oxide film was polished at a rotating speed of about 80/80 rpm (head/pad). The polishing rate for and the polishing selectivity ratio of the oxide film to the nitride film using the polishing slurries of Preparation Examples 37 to 40 are shown in Table 3.

TABLE 3

| Preparation Example | Slurry Composition | pH | SiO$_2$ film polishing rate [Å/min] | Si$_3$N$_4$ film polishing rate [Å/min] | Polishing selectivity ratio [SiO$_2$:Si$_3$N$_4$] |
|---|---|---|---|---|---|
| 37 | Wet ceria 1 weight % DCN 0.03 weight % Citric acid 0.004 weight % | 4 | 413 | 53 | 8:1 |
| 38 | | 6 | 864 | 140 | 6:1 |
| 39 | | 8 | 936 | 261 | 4:1 |
| 40 | | 10 | 646 | 142 | 4.5:1 |

Figure 8:
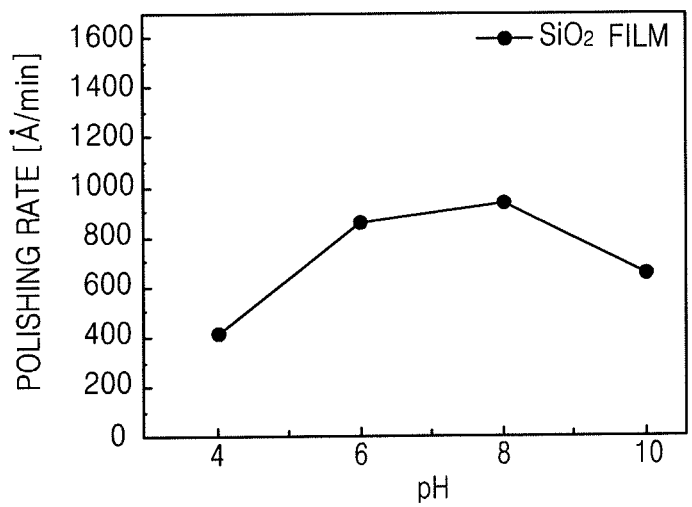
FIG. 8 illustrates a graph showing polishing rate for an oxide according to a pH of a polishing slurry.
Figure 9:
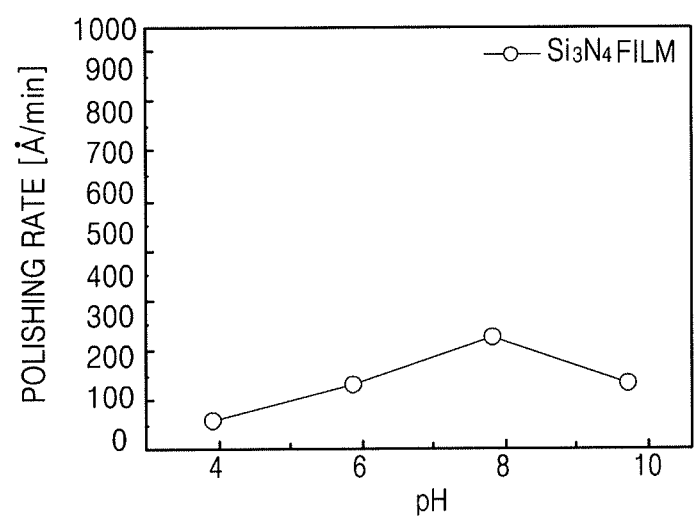
FIG. 9 illustrates a graph showing a polishing rate of a nitride according to a pH of a polishing slurry.

FIG. 8 illustrates a graph showing polishing rate for an oxide according to a pH of the polishing slurry, and FIG. 9 illustrates a graph showing polishing rate for a nitride according to a pH of the polishing slurry.

Referring to Table 3, it was confirmed that when the oxide polishing promoter and the nitride polishing inhibitor were not added to the polishing slurry, a low polishing selectivity ratio may be satisfied by controlling the pH alone (about 5:1). An alkaline range may be, for example, a pH of 8 to 10 or, for example, a pH of 8.

By way of summation and review, in a CMP process performed on an interlayer dielectric (ILD) film in an interlayer dielectric portion of a semiconductor among processes to which such CMP techniques are applied, a technique of depositing nitrides and oxides on a pattern in this stated order and then planarizing the oxides by CMP may be provided. In this case, selective polishing characteristics, in which a polishing rate of an insulating material such as an oxide film is increased, and a polishing rate of a nitride film is decreased are desirable.

As such, when various types of materials to be polished are present in the same layer, selective polishing characteristics of film layers with different constituent materials may significantly depend on the characteristics of abrasive particles and chemical additives. In addition, the confirmation of chemical compositions of these abrasive particles and chemical additives is a desirable aspect in achieving desired polishing rates, planarization, and selectivity.

The use of a polishing slurry according to embodiments may result not only in a high polishing rate for an oxide, but also in a polishing rate for a nitride within an optimal range. In addition, the polishing selectivity ratio of the oxide to the nitride may be adjusted to have a desired difference in a polishing rate for the oxide and the nitride, thereby improving the polishing stability of the polishing slurry.

What is claimed is:

1. A polishing slurry, comprising:
an abrasive material;
a first oxide polishing promoter that includes a polymer-based oxide polishing promoter;
a second oxide polishing promoter that includes an alkanolamine-based monomolecular material containing a hydroxyl group and an amine group;
a first nitride polishing inhibitor that includes an anionic nitride polishing inhibitor; and
a second nitride polishing inhibitor including polyoxyethylene stearyl amine ether,
wherein an amount of the second oxide polishing promoter is in a range of about 0.01 weight % to about 1.35 weight % based on the total weight of the polishing slurry,
the polymer-based oxide polishing promoter includes poly(3,4-ethylenedioxythiophene), and
the alkanolamine-based monomolecular material containing a hydroxyl group and an amine group includes at least one selected from aminomethyl propanol, heptaminol, isoetharine, methanolamine, diethylethanolamine, and N-methylethanolamine.

2. The polishing slurry as claimed in claim 1, wherein the first nitride polishing inhibitor includes a carboxyl group-containing anionic material.

3. The polishing slurry as claimed in claim 1, wherein the first nitride polishing inhibitor includes at least one selected from poly(acrylic acid) (PAA), poly(alkyl methacrylate), acrylamide, methacrylamide, and ethyl-methacrylamide.

4. The polishing slurry as claimed in claim 1, wherein an amount of the first oxide polishing promoter is in a range of about 0.004 weight % to about 0.03 weight % based on the total weight of the polishing slurry.

5. The polishing slurry as claimed in claim 1, wherein an amount of the first oxide polishing promoter is in a range of about 0.004 weight % to about 0.02 weight % based on the total weight of the polishing slurry.

6. The polishing slurry as claimed in claim 1, wherein an amount of the first nitride polishing inhibitor is in a range of about 0.01 weight % to about 0.08 weight % based on the total weight of the polishing slurry.

7. The polishing slurry as claimed in claim 1, wherein an amount of the second nitride polishing inhibitor is in a range of about 0.002 weight % to about 0.02 weight % based on the total weight of the polishing slurry.

8. The polishing slurry as claimed in claim 1, wherein the abrasive material includes ceria (CeO$_2$).

9. The polishing slurry as claimed in claim 1, wherein an amount of the abrasive material is in a range of about 0.1 weight % to about 10 weight % based on the total weight of the polishing slurry.

10. The polishing slurry as claimed in claim 1, further comprising a dispersing agent that disperses the abrasive material.

11. The polishing slurry as claimed in claim 1, wherein the polishing slurry has a polishing selectivity ratio of oxides to nitrides in a range of about 30:1 to about 300:1.

12. A method of polishing a substrate, the method comprising:
preparing a substrate on which a nitride film and an oxide film are formed, the oxide film being formed on a surface of the substrate; and
polishing the oxide film on the surface of the substrate by supplying a polishing slurry to the substrate, wherein the polishing slurry includes:
an abrasive material;
a first oxide polishing promoter that includes a polymer-based oxide polishing promoter;
a second oxide polishing promoter that includes an alkanolamine-based monomolecular material containing a hydroxyl group and an amine group;
a first nitride polishing inhibitor that includes an anionic nitride polishing inhibitor; and
a second nitride polishing inhibitor including polyoxyethylene stearyl amine ether,
an amount of the second oxide polishing promoter is in a range of about 0.01 weight % to about 1.35 weight % based on the total weight of the polishing slurry,
the polymer-based oxide polishing promoter includes poly(3,4-ethylenedioxythiophene), and
the alkanolamine-based monomolecular material containing a hydroxyl group and an amine group includes at least one selected from aminomethyl propanol, heptaminol, isoetharine, methanolamine, diethyletha-nolamine, and N-methylethanolamine.

13. The method as claimed in claim 12, wherein preparing the substrate includes:
forming a pattern on the substrate;
forming the nitride film on the pattern; and
forming the oxide film on the nitride film.

14. A polishing slurry, comprising:
an abrasive material, an amount of the abrasive material being in a range of about 0.1 weight % to about 10 weight % based on the total weight of the polishing slurry;
a first oxide polishing promoter that includes a polymer-based oxide polishing promoter, an amount of the first oxide polishing promoter being in a range of about 0.004 weight % to about 0.03 weight % based on the total weight of the polishing slurry;
a second oxide polishing promoter that includes an alkanolamine-based monomolecular material containing a hydroxyl group and an amine group, an amount of the second oxide polishing promoter being in a range of about 0.01 weight % to about 1.35 weight % based on the total weight of the polishing slurry;
a first nitride polishing inhibitor that includes an anionic nitride polishing inhibitor, an amount of the first nitride polishing inhibitor being in a range of about 0.01 weight % to about 0.08 weight % based on the total weight of the polishing slurry; and
a second nitride polishing inhibitor including polyoxyethylene stearyl amine ether, an amount of the second nitride polishing inhibitor being in a range of about 0.002 weight % to about 0.02 weight % based on the total weight of the polishing slurry, wherein
the polymer-based oxide polishing promoter includes poly(3,4-ethylenedioxythiophene),
the alkanolamine-based monomolecular material containing a hydroxyl group and an amine group includes at least one selected from aminomethyl propanol, heptaminol, isoetharine, methanolamine, diethyletha-nolamine, and N-methylethanolamine, and
the first nitride polishing inhibitor includes a carboxyl group-containing anionic material.

* * * * *